United States Patent
Rosen et al.

(10) Patent No.: US 6,535,722 B1
(45) Date of Patent: Mar. 18, 2003

(54) TELEVISION TUNER EMPLOYING MICRO-ELECTRO-MECHANICALLY-SWITCHED TUNING MATRIX

(75) Inventors: Arye Rosen, Cherry Hill, NJ (US); Stewart Mark Perlow, Marlboro, NJ (US); Raymond Louis Camisa, East Windsor, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/206,429

(22) Filed: Dec. 7, 1998

Related U.S. Application Data (60) Provisional application No. 60/092,178, filed on Jul. 9, 1998.

(51) Int. Cl.$^7$ .................................................. H04B 1/18
(52) U.S. Cl. ................................ 455/188.2; 455/189.1; 455/190.1; 455/191.1; 455/193.1; 455/180.2; 455/266; 455/339; 455/340; 348/731; 333/174; 333/205
(58) Field of Search ........................... 455/188.2, 189.1, 455/190.1, 191.1, 193.1, 193.2, 180.2, 266, 339, 340; 348/731; 333/174, 205

(56) References Cited

U.S. PATENT DOCUMENTS

| | | |
|---|---|---|
| 3,766,483 A | 10/1973 | Wolfram |
| 3,796,976 A | 3/1974 | Heng et al. |
| 4,186,360 A | 1/1980 | Ohashi |
| 4,622,528 A | 11/1986 | Milard |
| 5,367,136 A | 11/1994 | Buck |
| 5,430,597 A | 7/1995 | Bagepalli et al. |
| 5,619,061 A | 4/1997 | Goldsmith et al. |
| 5,629,565 A | 5/1997 | Schlaak et al. |

(List continued on next page.)

OTHER PUBLICATIONS

K.E. Peterson, "Micromechanical Membrane Switches on Silicon," IBM Journal of Research and Development, vol. 23, No. 4 Jul. 1979, pp. 376–385.

(List continued on next page.)

*Primary Examiner*—William Trost
*Assistant Examiner*—Danh C Le
(74) *Attorney, Agent, or Firm*—William J. Burke (57) ABSTRACT

A tuning circuit, as for a television receiver or video recorder, employs switchable tuning circuits including micro-electronic electro-mechanical switches for selecting the ones of an array of capacitors and/or inductors as is useful in tunable circuits. The array of capacitors and/or inductors and micro-electro-mechanical switches of the switched tuning matrix is formed on an integrated circuit or an electronic circuit substrate along with amplifiers and other electronic elements of the tuning circuit for which the switched tuning matrix is employed. The switchable capacitance and inductance matrices are well suited for use in the resonators employed in the pre-selector filters, post-selector filters and oscillators of electronic tuners, such as those employed in television receivers and video recorders. The capacitors and micro-electro-mechanical switches may be connected to select a particular capacitor of the array of capacitors or to select ones of the capacitors of the array of capacitors to establish a particular capacitance value. The capacitors of the array of capacitors may be of like value or may be of different values, such as would advance simplified response to a digital control word, such as a 1-2-4-8 weighting or a 1-2-2-4 weighting. Similarly, the inductors and micro-electro-mechanical switches may be connected to select a particular inductor of the array of inductors or to select ones of the inductors of the array of inductors to establish a particular inductance value. The inductors of the array of inductors may be of like value or may be of different values, such as would advance simplified response to a digital control word, such as a 1-2-4-8 weighting or a 1-2-2-4 weighting.

31 Claims, 5 Drawing Sheets

U.S. PATENT DOCUMENTS

| | | | | |
|---|---|---|---|---|
| 5,638,946 | A | | 6/1997 | Zavracky |
| 5,656,785 | A | | 8/1997 | Trainor et al. |
| 5,808,527 | A | * | 9/1998 | De Los Santos ............ 333/205 |
| 5,847,612 | A | * | 12/1998 | Birleson ........................ 331/2 |
| 5,859,674 | A | | 1/1999 | Chevallier |
| 5,983,088 | A | * | 11/1999 | Aschwanden ............ 455/188.2 |
| 6,016,170 | A | * | 1/2000 | Takayama et al. .......... 348/731 |
| 6,150,901 | A | * | 11/2000 | Auken ........................ 333/174 |
| 6,188,970 | B1 | * | 2/2001 | Becker et al. .............. 702/106 |

OTHER PUBLICATIONS

J.J. Yao et al., "A Surface Micromachined Miniature Switch for Telecommunications Applications with Signal Frequencies From DC Up To 4GHZ," Transducers '95—Eurosensors IX, The 8th International Conference on Solid State Sensors and Actuators, and Eurosensors IX, Stockholm, Sweden, Jun. 25–29, 1995, pp. 384–387.

C. Goldsmith et al., "Characteristics of Micromachined Switches at Microwave Frequencies," *1996 IEEE MTT–S Digest*, pp. 1141–1144.

C. Goldsmith et al., "Micromechanical Membrane Switches for Microwave Applications," *1995 IEEE MTT–S Digest*, pp. 91–94.

C. Storment et al., "Flexible, Dry–Released Process for Aluminum Electrostatic Actuators," *Journal of Micro Electro Mechanical Systems*, vol. 3, No. 3, Sep. 1994, pp. 90–96, and Erratum, Id. vol. 4, No. 1, Mar. 1995, p. 60.

R. Allan, "MEMS Technology Pursued For The Development of Micromachined Silicon Variable Inductors and Latching Accelerometers," *Electronic Design*, Jun. 23, 1997, pp. 27, 28, 30, 32.

R. Engelke, "Mixed–Technology MEMS Design Tools Under Development," *Electronic Design*, Jun. 23, 1997, p. 24.

H. Bates et al., "The electronic nose in Lilliput", *IEEE Spectrum*, Spet. 1998, pp. 35–38.

\* cited by examiner

TELEVISION TUNER EMPLOYING MICRO-ELECTRO-MECHANICALLY-SWITCHED TUNING MATRIX

This application claims the benefit of U.S. Provisional Application Ser. No. 60/092,178 entitled "MICRO-ELECTRO-MECHANICALLY-SWITCHED CAPACITOR MATRIX" filed Jul. 9, 1998.

The present invention relates to television tuners and, in particular, to television tuners employing micro-electro-mechanically switched tuning matrices, which tuning matrices may include capacitance and/or inductance elements.

From the early days of radio, the need for tunable resonant electrical circuits was recognized. Large mechanical tuning elements, such as air-dielectric capacitors and air-core inductors, in time gave way to smaller, more efficient capacitors and inductors. In the continuing evolution from vacuum tubes to transistors to integrated circuits, the trend has been for ever-decreasing size and cost. To this end, micro-electronic circuits and integrated electronic circuits have become the mainstay of modern-day electronics.

In the field of television (TV) tuners and other superheterodyne receivers, for example, this evolution has seen the vacuum tubes and multi-gang mechanical switches with discreet capacitors, inductors and resistors soldered thereon yield to transistorized printed-wiring circuit boards, and the transistorized circuit boards yield to micro-electronic and integrated circuits mounted on printed-wiring substrates. But even modem integrated circuit TV tuners still employ discrete components for the capacitive and inductive tuning elements.

The electronically-controllable variable tuning elements currently employed are semiconductor varactor diodes which exhibit a capacitance that varies inversely to the magnitude of the DC reverse bias voltage applied thereto. Varactor diodes are coupled to inductors or to a transmission line having inductive reactance to form resonators that are employed in the pre-selector filters, post-selector filters and oscillators of tunable receivers such as modern TV tuners.

Figure 1:
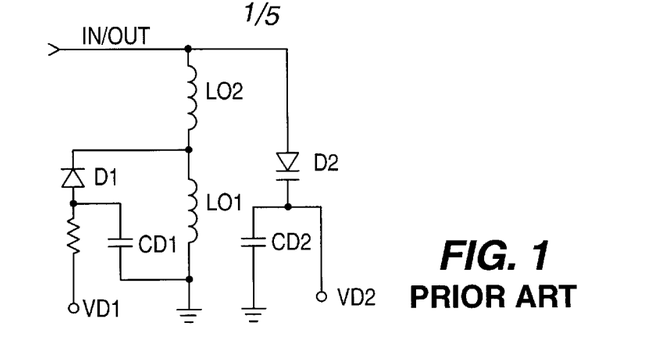
FIG. 1 is a schematic diagram of a prior art tunable circuit.

For example, FIG. 1 shows a conventional tunable circuit of this sort in which the resonant frequency is determined by the value of the capacitance exhibited by varactor diode D2 and the inductance of inductors L01 and L02. PIN diode D1 provides band switching under the control of voltage VD1. With switching voltage VD1 at +20 volts, diode D1 is open (nonconductive) and inductors L01 and L02 in series form the inductance of the tunable circuit; and with switching voltage VD1 at −20 volts, D1 is conductive substantially shorting inductor L01, thereby leaving L02 as the inductance of the tunable circuit. Varactor diode D2 exhibits a variable capacitance in response to tuning voltage VD2 changing between about +1 to +20 volts. Capacitors CD1 and CD2 are needed to provide DC isolation for the control voltage VD1 and the tuning voltage VD2, respectively, and have capacitances sufficiently large as not to undesirably affect the resonant frequency of the tunable circuit. Thus, the need for discrete electronic components and for additional components for DC isolation tends to increase the size, assembly difficulty and the cost of these products, all of which are not desirable.

Unfortunately, varactor diodes also have undesirable electrical characteristics that limit their usefulness and the performance obtainable. Firstly, the capacitance of a varactor diode is a non-linear function of its reverse bias voltage, thereby being a source of distortion of the signals applied to or passed through the varactor diode. Secondly, varactor diodes are relatively lossy and so will exhibit a relatively low Q. The effect of a low Q on the tuned circuits of a typical TV tuner is to produce greater signal losses, to limit the sharpness, selectivity and narrow bandwidth capability of filters, and to increase the overall noise figure, and thereby increase the signal-to-noise ratio, of the tuner.

Accordingly, there is a need for tunable circuits that will have lower distortion, higher Q, and improved filter characteristics, and that will enable tuners having lower distortion, improved image rejection and adjacent channel rejection, and a lower noise figure.

To this end, the tuner of present invention comprises a tunable bandpass filter on a substrate having a passband including a resonant frequency responsive to a tuning control signal, a tunable oscillator on the substrate generating a controllable frequency signal responsive to a frequency control signal, and a mixer on the substrate coupled to the tunable bandpass filter for receiving signals in the passband and coupled to the tunable oscillator for receiving the controllable frequency signal. The tunable bandpass filter includes a resonant circuit comprising a plurality of capacitors formed of conductive layers and dielectric layers on the substrate; and a plurality of switches formed of layers of materials on the substrate, wherein the switches are selectively opened and closed by movement of a switch arm in response to the tuning control signal, and wherein ones of the plurality of switches selectively couple respective ones of the plurality of capacitors to a conductive connection on the substrate. A tuning control generates the tuning control signal and the frequency control signal.

The present invention also comprises a method for fabricating a matrix of a plurality of capacitors and electro-mechanical switches connected in circuit on a substrate by:

depositing a conductive layer on parts of the substrate to form a plurality of capacitor plates, and to form a plurality of switch contacts and a plurality of control conductors associated with respective ones of the plurality of switch contacts;

depositing a dielectric layer on each of the plurality of capacitor plates and another conductive layer on each dielectric layer to form the plurality of capacitors on the substrate;

forming a removable layer overlaying the plurality of switch contacts and at least portions of the plurality of control conductors associated therewith, the removable layer having a plurality of holes therethrough with one of the holes proximate to each control conductor;

depositing a second conductive layer on the removable layer, the second conductive layer forming a plurality of conductive areas, each conductive area overlying a respective one of the control conductors, a respective one of the switch contacts and being attached to the substrate through a respective one of the holes to form a respective switch arm associated with one of the plurality of switch contacts;

removing the removable layer to leave the plurality of switch arms spaced apart from the substrate and attached thereto at one end thereof and spaced apart from the respective switch contact associated therewith at its other end; and depositing a plurality of conductive connections between ones of the capacitors, ones of the switch arms and ones of the switch contacts to connect ones of the capacitors and the electro-mechanical switches in circuit on the substrate.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT

Figure 2:
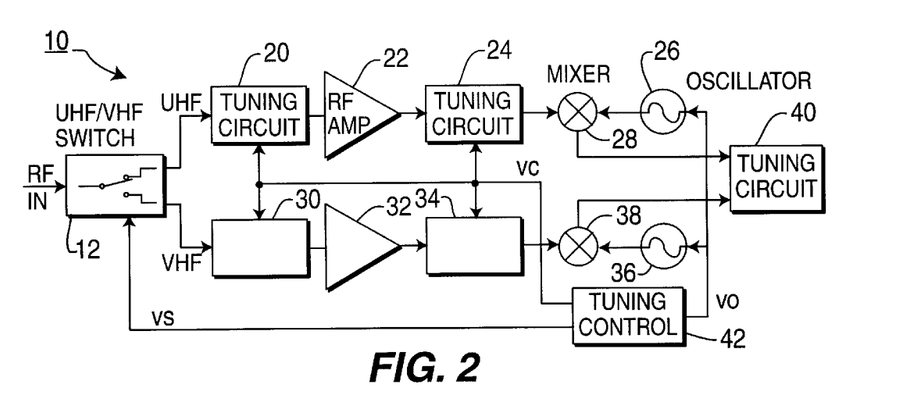
FIG. 2 is a schematic block diagram of a television tuner including an embodiment according to the present invention.

In FIG. 2 is shown an exemplary embodiment of a tunable system employing tunable circuits including the present invention. Specifically, a two-band television tuner 10 includes a single-pole-double-throw (SPDT) switch 12 that routes received incoming radio frequency (RF) signals to either a UHF-band tuner or a VHF-band tuner under control of a switch control voltage VS generated by tuning control 42. The UHF-band tuner includes a pre-selector tuning circuit 20 that includes a tunable bandpass filter circuit having a center frequency tuned to the RF carrier signal frequency $f_{RF}$ of the UHF channel to be selected and a bandwidth compatible with that of such channel, e.g., about 6 MHz for conventional TV channels. RF amplifier 22 amplifies the pre-selected UHF channel signal and applies it to post-selector tuning circuit 24 which, like pre-selector tuning circuit 20, includes a tunable bandpass filter circuit having a center frequency tuned to the carrier signal frequency $f_{RF}$ of the UHF channel to be selected and a bandwidth compatible with that of such channel. Tuning circuits 20 and 24 are tunable by a switched capacitance/inductance array including a plurality of micro-electro-mechanical (MEM) switches operable in response to control signals VC generated by tuning control 42. UHF mixer 28 receives at one of its inputs the amplified, bandwidth-limited RF signal from tuning circuit 24 and at the other of its inputs a frequency signal $f_{LO}$ generated by voltage-controlled local oscillator 26. The frequency $f_{LO}$ of local oscillator 26 is selected to generate at the output of mixer 28 a beat frequency $f_{IF}$ at a predetermined fixed intermediate frequency (IF) of the tuner, e.g., about 45 MHz. As is known, $f_{RF} - f_{LO} = f_{IF}$. IF tuning circuit 40 is a bandpass filter circuit having a center frequency at the predetermined fixed IF frequency $f_{IF}$ of the tuner and a bandwidth compatible with that of such channel, e.g., about 6 MHz for conventional television channels.

Similarly, the VHF-band tuner includes a pre-selector tuning circuit 30 that includes a tunable bandpass filter circuit having a center frequency tuned to the RF carrier signal frequency $f_{RF}$ of the VHF channel to be selected and a bandwidth compatible with that of such channel, e.g., about 6 MHz. RF amplifier 32 amplifies the pre-selected VHF channel signal and applies it to post-selector tuning circuit 34 which, like pre-selector tuning circuit 30, includes a tunable bandpass filter circuit having a center frequency tuned to the carrier signal frequency $f_{RF}$ of the VHF channel to be selected and a bandwidth compatible with that of such channel. Tuning circuits 30 and 34 are tunable by a switched capacitance array including, for example, a plurality of micro-electro-mechanical (MEM) switches operable in response to control signals VC generated by tuning control 42. VHF mixer 38 receives at one of its inputs the amplified, bandwidth-limited RF signal from tuning circuit 34 and at the other of its inputs a frequency signal $f_{LO}$ generated by voltage-controlled local oscillator 36. The frequency $f_{LO}$ of local oscillator 36 is selected to generate at the output of mixer 38 a beat frequency $f_{IF}$ at a predetermined fixed intermediate frequency (IF) of the tuner, e.g., about 45 MHz, which is applied to IF tuning circuit 40.

Each of tuning circuits 20, 24, 30 and 34 includes a switched capacitance array, or switched capacitance and inductance arrays, and micro-electro-mechanical switches formed on a substrate according to the present invention. Because UHF tuning circuits 20 and 24 operate at the same time and are tuned to the same UHF frequency, the same tuning control signals VC may be applied to both, thereby simplifying tuning control signal generator 42. Similarly, because VHF tuning circuits 30 and 34 operate at the same time and are tuned to the same VHF frequency, the same tuning control signals VC may be applied to both, thereby simplifying tuning control signal generator 42. Because UHF tuning circuits 20, 24 are not operated at the same time as are VHF tuning circuits 30, 34, i.e. either the UHF band or the VHF band is selected by switch 12, but not both, the same tuning control signals VC may be used for both sets of tuning circuits 20, 24, 30, 34, thereby further simplifying tuning control signal generator 42. In addition, local oscillators 26 and 36 may also include a micro-electro-mechanically-switched tuning array, for example, a capacitance array, according to an aspect of the present invention for selecting the frequency $f_{LO}$ of its output signal. The tuning control signals VO for local oscillators 26 and 36 are also generated by tuning control signal generator 42, and may be the same tuning control signals VC as are employed to control tuning circuits 20, 24, 30, 34. Tuning control signal generator 42 generates the aforementioned control signals in response to selection of a channel by a user, e.g., a person pressing buttons on a TV remote control or on a TV receiver.

Figure 3:
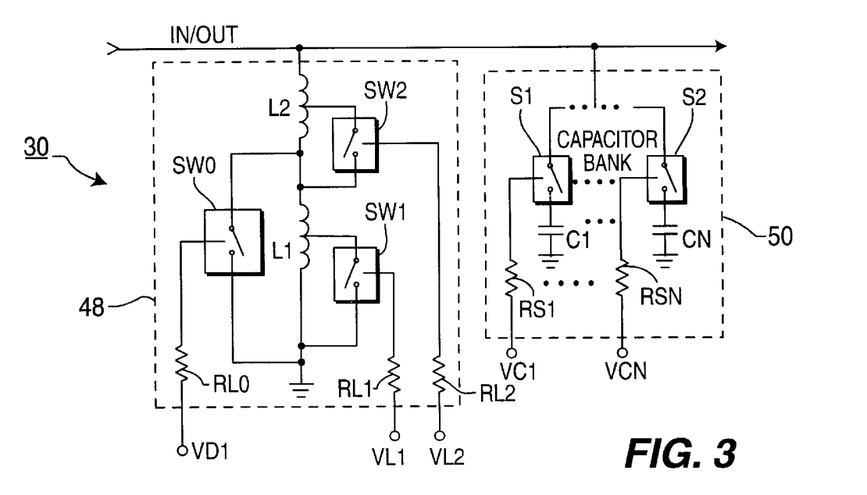
FIG. 3 is a simplified schematic diagram of a tunable circuit including an embodiment according to an aspect of the present invention.

FIG. 3 is a simplified schematic diagram of a tuning circuit including the present invention as may be employed, for example, in tuning circuits 20, 24, 30 and 34 of the TV tuning system described in relation to FIG. 2 above. In tuning circuit 30, a switchable inductance matrix 48 including inductors L1 and L2 provides the inductance and switchable capacitance matrix 50 provides the capacitance of the tunable resonant tuned circuit. MEM switch SW0 is controlled by control signal VL0 for selectively not shorting inductor L1 for selecting the low-frequency (57–85 MHz for VHF channels 2–6) portion of the TV VHF band or for selectively shorting inductor L1 for selecting the high-frequency (177–213 MHz for VHF channels 7–13) portion of the TV VHF band. In addition, a portion of inductor L1 may be shorted by closing MEM switch SW1 in response to control signal VL1 so as to further divide the lower VHF band into two sub-bands and a portion of inductor L2 may be shorted by closing MEM switch SW2 in response to control signal VL2 so as to further divide the upper VHF band into two sub-bands, thereby reducing the range of capacitance values needed to tune tunable circuit 30 over the full range of VHF carrier frequencies.

Switchable capacitance matrix 50 of tuning circuit 30 includes an array of capacitors C1, C2, . . . CN that are formed on a substrate with the MEM switches S1, S2, . . . SN. C1, C2, . . . CN may be connected in parallel with the inductance of inductors L1, L2 of switchable inductance matrix 48 by closing MEM switches S1, S2, . . . SN, respectively. MEM switches S1, S2, . . . SN are controlled by switch control voltages VC1, VC2, . . . VCN, respectively, to selectively close and thereby select the ones of capacitors C1, C2, . . . CN necessary to resonate with the inductance of inductors L1, L2 at the desired center frequency $f_{RF}$ of the tunable bandpass filter 30. The aforementioned control voltages are each applied through a respective impedance which may include resistors and/or RF inductors, illustrated by respective wavy lines RL0, RL1, RL2, RS1 . . . RSN, to isolate the control voltages applied to the MEM switch from the signals coupled through the MEM switch contacts.

Exemplary switch control voltage states for MEM switches SW0–SW2 and S1, S2, . . . SN to select VHF channels 2 through 13 are listed in Table 1 below, wherein "Gnd" indicates that no potential is applied and the MEM switch is open and "+V" indicates that a positive control voltage is applied sufficient to close the MEM switch.

Figure 4:
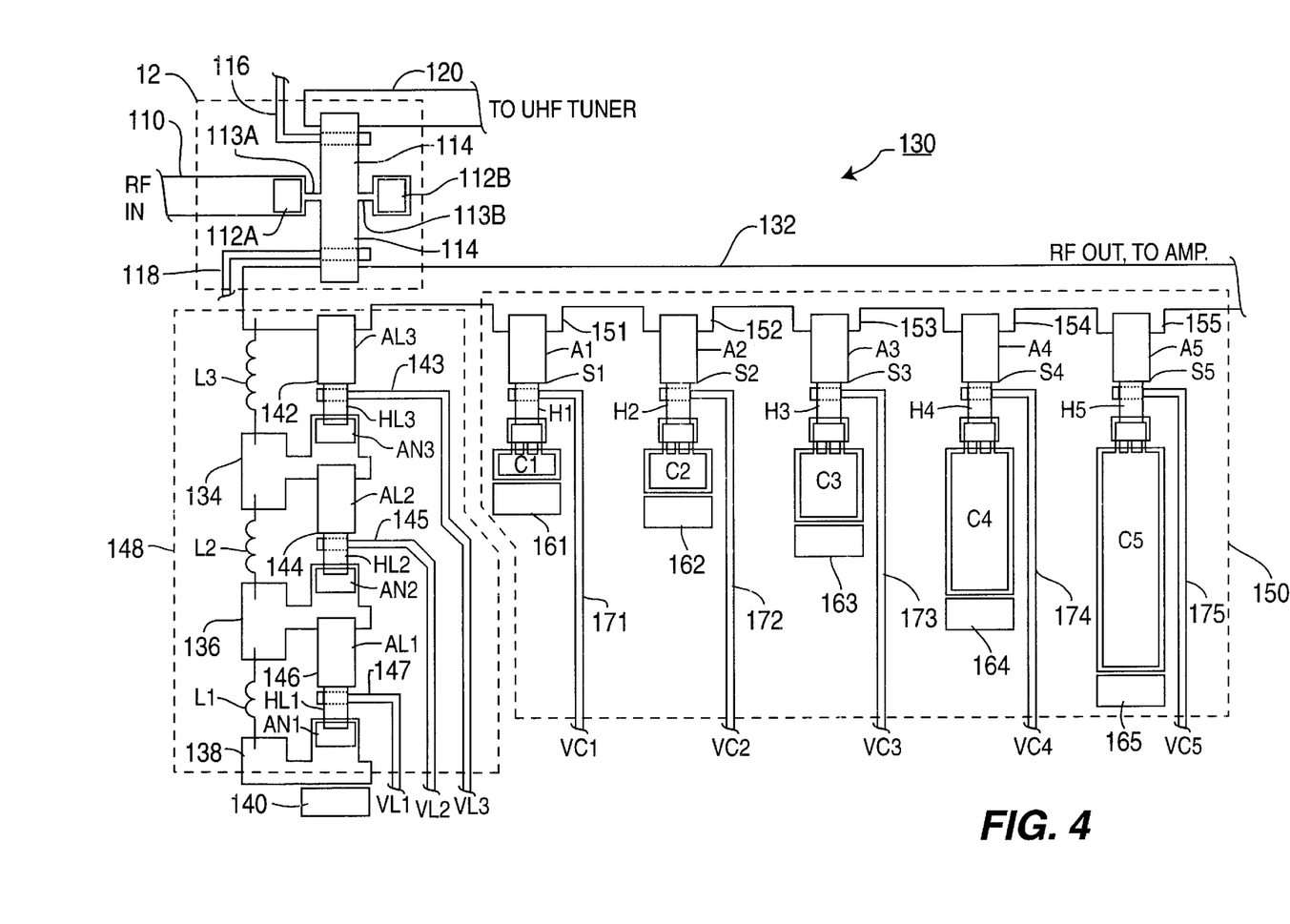
FIG. 4 is a plan view of a portion of the surface of an integrated circuit embodiment of a portion of the tunable circuit of FIG. 3.

132 to complete an electrical connection from conductor 110 to conductor 132 for coupling the received RF signal to tunable pre-selector filter 130 of a VHF-band tuner. Filter 130 includes an inductance L1, L2, L3 in parallel with a capacitance C1, C2, C3, C4, C5 to form a tunable parallel resonant circuit.

Switchable inductance matrix 148 includes inductors L1, L2, L3, shown symbolically because they may be either integrated inductors formed on the substrate 100 or discrete inductors not formed on the substrate 100, connected in series between conductor 132 and ground 138, 140. Each inductor L1, L2, L3 of switchable inductance matrix 148 has a MEM switch 146, 144, 142, respectively, connected in parallel therewith. Inductor L1 is connected between conductors 136 and 138 which are selectively connected together by MEM switch 146 under control of switch control voltage VL1 applied via control line 147. When control voltage VL1 is applied, switch arm AL1 is electrostatically attracted to control line 147 causing flexible hinge HL1, which supports switch arm AL1 on anchor post AN1, to flex until switch arm AL1 contacts conductor 136, thereby to short inductor L1. Inductor L2 is connected between conductors 136 and 134 which are selectively connected together by MEM switch 144 under control of switch control voltage VL2 applied via control line 145. When control voltage VL2 is applied, switch arm AL2 is electrostatically attracted to control line 145 causing flexible hinge HL2, which supports switch arm AL2 on anchor post AN2, to flex until switch arm AL2 contacts conductor 134, thereby to short inductor L2. Similarly, inductor L3 is connected between conductors 134 and 132 which are selectively connected together by MEM switch 142 under control of switch control voltage VL3 applied via control line 143.

TABLE 1

Switch States for VHF Channel Selection

| Channel | Freq. MHz | VL0 | VL1 | VL2 | VC1 | VC2 | VC3 | ... | VCN-1 | VCN |
|---|---|---|---|---|---|---|---|---|---|---|
| 2 | 57 | Gnd | Gnd | Gnd | +V | +V | +V | ... | Gnd | Gnd |
| 3 | 63 | Gnd | Gnd | Gnd | +V | Gnd | Gnd | ... | Gnd | Gnd |
| 4 | 69 | Gnd | +V | Gnd | +V | Gnd | +V | ... | Gnd | Gnd |
| 5 | 79 | Gnd | +V | Gnd | +V | +V | Gnd | ... | Gnd | Gnd |
| 6 | 85 | Gnd | +V | Gnd | +V | Gnd | Gnd | ... | Gnd | Gnd |
| 7 | 177 | +V | Gnd | Gnd | Gnd | Gnd | Gnd | ... | +V | +V |
| 8 | 183 | +V | Gnd | Gnd | Gnd | Gnd | Gnd | ... | +V | +V |
| 9 | 189 | +V | Gnd | Gnd | Gnd | Gnd | Gnd | ... | +V | Gnd |
| 10 | 195 | +V | Gnd | +V | Gnd | Gnd | Gnd | ... | +V | Gnd |
| 11 | 201 | +V | Gnd | +V | Gnd | Gnd | Gnd | ... | Gnd | Gnd |
| 12 | 207 | +V | Gnd | +V | Gnd | Gnd | Gnd | ... | Gnd | Gnd |
| 13 | 213 | +V | Gnd | +V | Gnd | Gnd | Gnd | ... | Gnd | Gnd |

FIG. 4 is a plan view of a substrate 100 including exemplary arrangements of the switch 12 and tuning circuit 30 portions of the tuner shown in FIG. 2 above. Received RF signals on conductor 110 are coupled to SPDT MEM switch 12. Double pole switch arm 114 thereof is supported by torsionally-flexible hinges 113A, 113B extending from anchor posts 112A, 112B which raise the hinge arm 114 above the substrate 100. When a positive control voltage +V is applied to UHF select control line 116, switch arm 114 is electrostatically attracted thereby and rotates about hinges 113A, 113B until it contacts conductor 120 to complete an electrical connection from conductor 110 to conductor 120 for coupling the received RF signal to a UHF-band tuner (not shown in FIG. 4). In like manner, when a positive control voltage +V is applied to VHF select control line 118, switch arm 114 is electrostatically attracted thereby and rotates about hinges 113A, 113B until it contacts conductor When control voltage VL3 is applied, switch arm AL3 is electrostatically attracted to control line 143 causing flexible hinge HL3, which supports switch arm AL3 on anchor post AN3, to flex until switch arm AL3 contacts conductor 132, thereby to short inductor L3.

Switchable capacitance matrix 150 includes an array of capacitors C1, C2, C3, C4, C5 formed on substrate 100. Each of capacitors C1, C2, C3, C4, C5 is selectively connected between a respective contact area 151, 152, 153, 154, 155 of conductor 132 and a respective ground conductor 161, 162, 163, 164, 165 by a respective micro-electromechanical (MEM) switch S1, S2, S3, S4, S5. MEM switch S1 includes a switch arm A1 cantilevered from anchor post AN1 by flexible hinge H1. Hinge H1 flexes to allow switch arm A1 to contact the contact area 151, thereby completing a conductive connection from the upper plate of capacitor C1 to contact area 151, under the influence of the electrostatic force attracting switch arm A1 to control line 171 when control voltage VC1 is applied thereto. In like manner, MEM switches S2–S5 include respective switch arms A2–A5 that are respectively cantilevered from anchor posts AN2–AN5 by flexible hinges H2–H5, respectively. Hinges H2–H5 flex to allow switch arms A2–A5 to respectively contact the respective contact areas 152–155, thereby completing conductive connections from the respective upper plates of capacitors C2–C5 to contact areas 152–155, respectively, under the respective influences of the electrostatic forces attracting switch arms A2–A5 to their respective control lines 172–175 when control voltages VC2–VC5 are respectively applied thereto.

In FIG. 4, capacitors C1–C5 are proportionately sized in area in a ratio of about 1:2:4:8:12. Because the capacitance of a capacitor is directly proportional to the area of its plates, the capacitances of capacitors C1–C5 are in substantially the same 1:2:4:8:12 proportion. Accordingly, a total capacitance value $C_T$ is in a range between the capacitance $C_{C1}$ of capacitor C1 and twenty-seven times that capacitance (i.e. $C_T=(1+2+4+8+12)$ $C_{C1}=27$ $C_{C1}$) as may be obtained with the various combinations of the open and closed positions of MEM switches S1–S5. The value of the increment of change of capacitance is the capacitance $C_{C1}$ of capacitor C1. It is advantageous to employ a capacitance ratio based on the number two for facilitating and simplifying the convenient interfacing of a digital control word produced by a digital processor, such as may be included in tuning control 42, to produce the control voltages, VC1, VC2, . . . VCN that are applied to the respective MEM switch control lines. Because the value of each of the foregoing control voltages VC1, VC2, . . . VCN is either zero or a positive voltage, each can be considered a binary bit and the set of control voltages VC1, VC2, . . . VCN can be considered a binary digital word. Thus, tuning control signal generator 42 generates a digital word control signal including the various individual control voltages VC1, VC2, . . . VCN applied to tuning circuits 20, 24, 30, 34 and local oscillators 26, 36.

Figure 5:
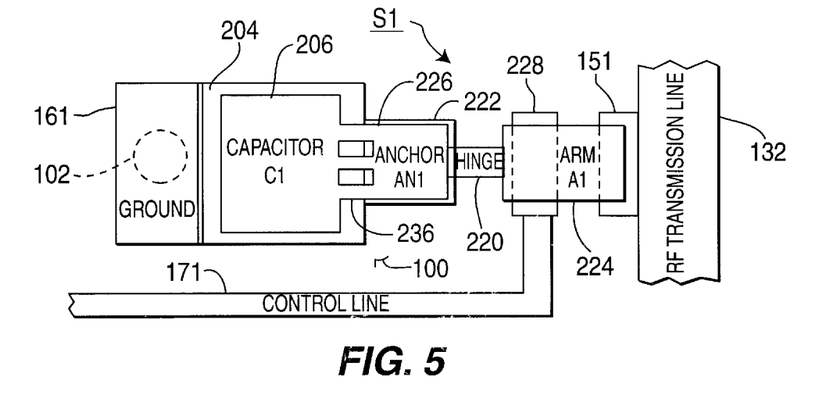
FIG. 5 is a plan view showing details of a portion of the integrated circuit embodiment of FIG. 4.
Figure 6:
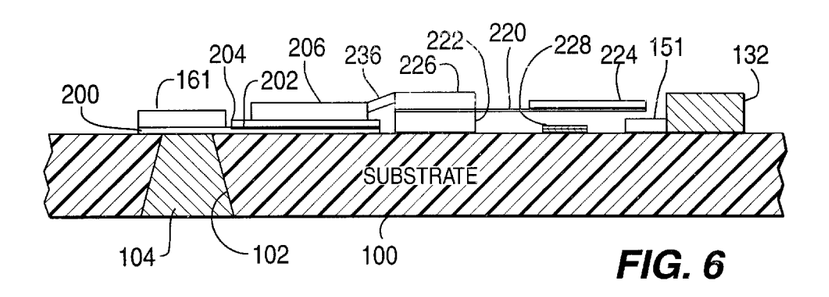
FIG. 6 is a sectional view of the portion of the integrated circuit embodiment shown in FIG. 5.

Specifically, the structure of the foregoing arrangement can best be appreciated by considering the enlarged plan view of capacitor C1 and MEM switch S1 as shown in FIG. 5 in conjunction with the corresponding side and sectional view thereof shown in FIG. 6. A ground conductor 200 deposited on substrate 100 forms the lower plate of capacitor C1. Capacitor C1 is formed of a dielectric layer 202, such as a silicon nitride or silicon dioxide layer, deposited on conductive lower plate 200 and a conductive upper plate 204 deposited on dielectric layer 202. Switch S1 is formed of an elongated thin metal flexible hinge member 220 cantilevered from the top of anchor base 222, which is deposited on substrate 100, and hinge member 220 extending to overlie switch contact 151. A switch arm member 224 is deposited on the end of hinge member 220 that is overlapping switch contact 151. Switch contact 151 is deposited on substrate 100 and RF transmission line conductor 132 is deposited on substrate 100 to overlie and contact switch contact 151. The end 228 of conductive control line 171 underlies switch arm 224 forming a capacitor therewith. When control voltage VC1 is applied to control line 171, the potential generates an electrostatic attraction force that causes hinge 220 to flex allowing switch arm 222 to move toward substrate 100 until switch arm 224 contacts switch contact 151, thereby closing the switch S1. It is preferred for certain applications that the end 228 of electrostatic control line 171 be enlarged and be overlaid with a dielectric and that switch arm 224 also be enlarged to increase both the size of the respective plates and the capacitance of the capacitor they form, thereby increasing the electrostatic attractive force generated by control potential VC1 for actuating MEM switch S1.

Additional conductive material is deposited to form a contact 206 on the upper plate 204 of capacitor C1, to form contact 226 on hinge member 220 overlying anchor base 222, and to form bridging conductors 236 therebetween. The same deposition may also form contact 161 on the remote end of the lower plate 200 of capacitor C1 and fill a via hole 102 in substrate 100 to form a via 104 by which connection to a point of ground potential is made.

Figure 7A:
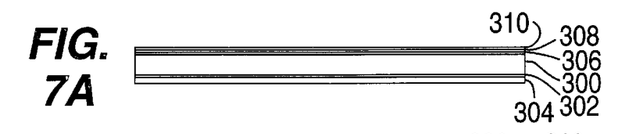
FIGS. 7A–7J are a series of cross-sectional views depicting the fabrication sequence of a switch of the sort shown in the exemplary embodiments of FIGS. 4–6.
Figure 7B:
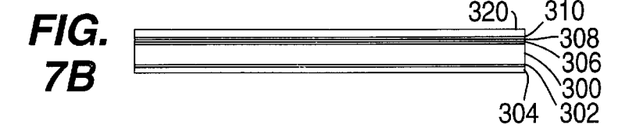
Figure 7C:
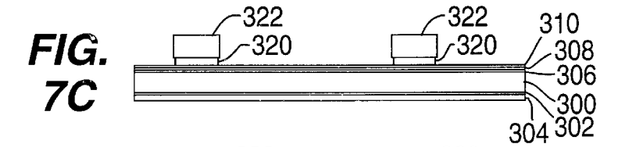

FIGS. 7A–7J are cross-sectional views showing the fabrication process sequence of a MEM switch and an associated capacitor of the sort described above in relation to FIGS. 4–6. FIG. 7A shows a substrate 300, for example, a ceramic substrate, that is metallized on its bottom side with a titanium layer 302 and then with a gold layer 304 which layers of metal will serve as the ground conductor or ground plane for the substrate 300. The top surface of substrate 300 is metallized with a layer of chromium 306, then with a layer of copper 308 and then with a further layer of chromium 310 from and upon which layers will be formed electrical conductors on the top surface of substrate 300, including control lines for the MEM switches and the lower plates of capacitors. In FIG. 7B, a 300 nanometer (nm) thick layer 320 of silicon nitride insulation is deposited on the upper chromium layer 310, from which layer will be formed various insulating members such as the dielectric layers of capacitors. For example, FIG. 7C shows a patterned photo-resist layer 322 atop that portion of silicon nitride insulator layer 320 that remains after the silicon nitride has been etched away to leave a dielectric layer 320 of a capacitor (on the left) and a dielectric layer on the MEM switch control conductor (on the right).

Figure 7D:
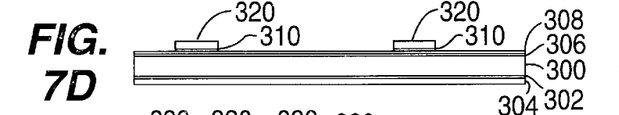
Figures 7E, 7F:
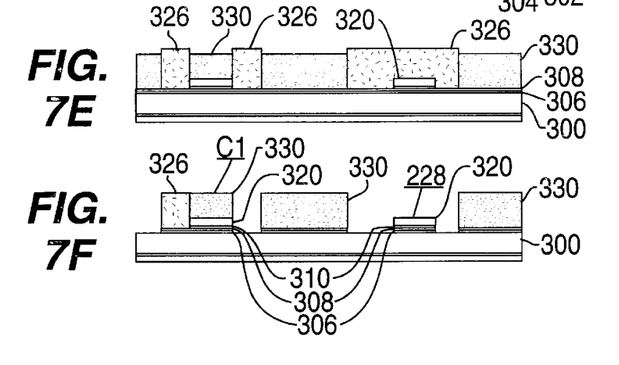

In FIG. 7D the remaining photo-resist 322 has been stripped away and the upper chromium layer 310 has been etched away to expose copper layer 308. Next, a patterned photo-resist 326 is applied to define the pattern of the electrical conductors as shown in FIG. 7E and a layer 330 of gold is plated onto the exposed portions of copper layer 308 to over-plate the pattern of the electrical conductors and onto the exposed portions of the dielectric layer 320 to form the second or top plate of the capacitors. Then, the photo-resist 326 is stripped away and the exposed portions of the copper layer 308 and the chromium layer 306 are etched away, as shown in FIG. 7F. At this step in the process, the structures of switch contact 151 and of switch control line 228, for example, of FIG. 6 have been formed, as have the plates 200, 204, 206 and the dielectric layer 202 of capacitor C1.

Figure 7G:
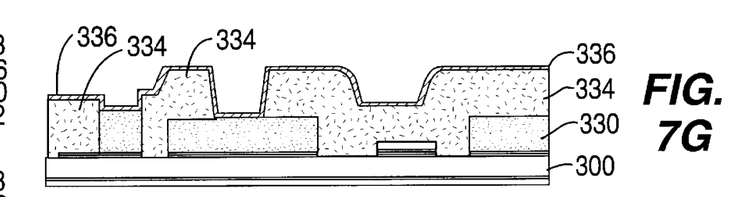
Figure 7H:
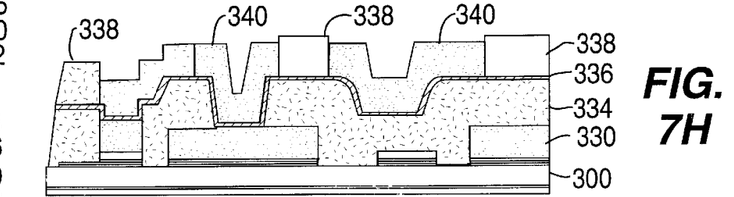
Figure 7I:
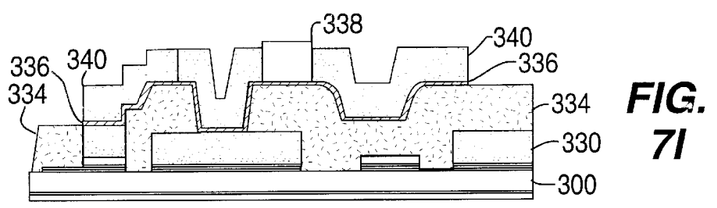
Figure 7J:
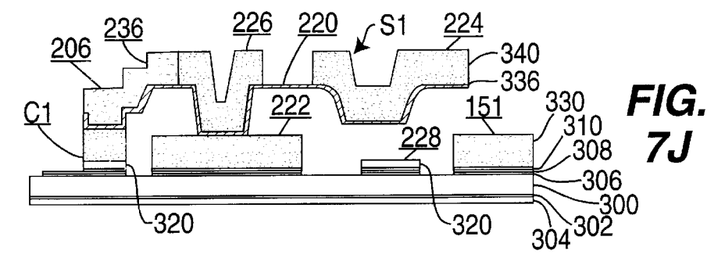

In FIG. 7G are shown a patterned photo-resist 334 with a metallized plating seed layer 336 of a titanium base and gold formed thereon, the plating seed layer 336 making electrical contact with the gold plated conductors 330 where holes in the pattern of photo-resist 334 exist, such as to the anchor base 222 of the MEM switch and the upper plate 206 of capacitor C1. Then, as shown in FIG. 7H, a further patterned layer 338 of photo-resist is applied over plating seed layer 336 and a patterned layer 340 of gold is plated onto the exposed portions of plating seed layer 336, such as on portions of switch arm A1, anchor base 222 and capacitor C1. In FIG. 7I, portions of patterned layer 338 of photo-resist is removed (or all of the photo-resist can be removed and a new patterned layer 338 of photo-resist applied) to expose those portions of the plating seed layer 336 that have not been gold plated 340 and are to be removed, and those portions of layer 336 are then etched away. Finally, all of the photo-resist is removed, such as by plasma washing the diced wafers from substrate 300 in oxygen, to leave the completed structure of MEM switch S1 and an interconnection 236 between the upper plate 206 of capacitor C1 and the hinge H1 of MEM switch S1 at the anchor 222, 226 thereof, as shown in FIG. 7J.

Thus, MEM switch S1 includes a hinge member 220 formed of the thin plating seed layer 336 which is cantilevered from anchor base 222 and which includes an enlarged contact 224 at the end of hinge member 220 remote from anchor base 222. Control line 228 underlies the movable end of switch S1 so that potential applied thereto will generate an attractive electrostatic force, enhanced by the presence of dielectric layer 320, drawing switch contact 224 downward until it contacts switch contact 151, thereby closing the switch S1 circuit. Capacitor C1 including dielectric layer 202 has its lower plate 200 connected to ground and its upper plate 204, 206 connected to one contact of switch S1 by the bridging interconnect 236.

For MEM switches intended to operate to switch signals in the frequency band of 2–40 Ghz, for example, with 50 ohm input and output transmission lines, the FR signal lines are about 4 mils wide. The arm of the MEM switch is about 2 mils wide and about 4–6 mils long, and is spaced about 2.5 $\mu$m from the substrate. The MEM switches actuate at a control voltage of about 20–28 volts in about 12 $\mu$sec, and release in about 18 $\mu$sec, exhibiting a series capacitance of about 0.015 pf (calculated) when open and a contact resistance in the range of about 1–5 ohms (measured) when closed.

Figure 8A:
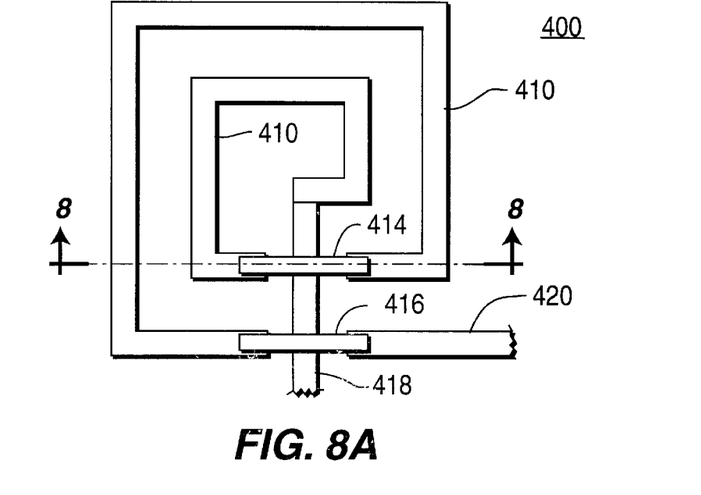
FIGS. 8A and 8B are a plan view and a side cross-sectional view, respectively, of an inductor according to an aspect of the present invention.
Figure 8B:
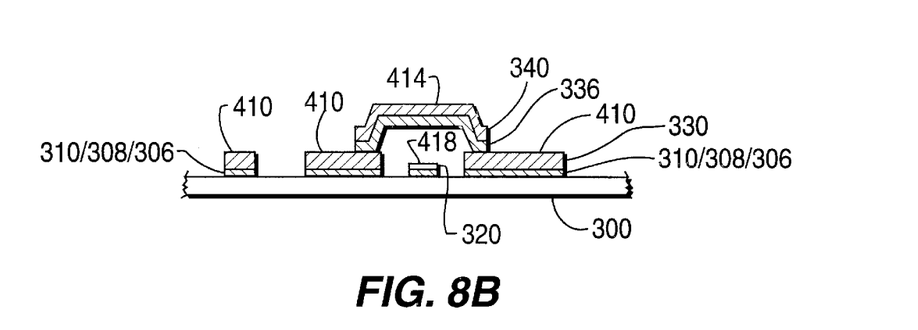

FIGS. 8A and 8B show an exemplary spiral inductor 400 of a sort that is conveniently formed on a substrate or an integrated circuit along with MEM switches, capacitors and matrices thereof. Spiral inductor 400 includes a spiral conductor 410 formed on a substrate 412 and having two lead conductors 418, 420 connected at opposite ends of spiral conductor 410 and formed on substrate 412. So that lead conductor 418 may be connected to the end of spiral conductor 410 at the center thereof, spiral conductor 410 has gaps therein through which lead conductor 418 passes. Conductive air bridges 414, 416 are spaced apart from the substrate 300 to pass over lead conductor 418 to provide conductive continuity of spiral conductor 410 across such gaps.

Spiral inductor 400 is fabricated on a substrate 300 simultaneously with the formation of MEM switches and capacitors thereon (substrate 300 is preferably the same substrate 100 on which are formed capacitors C1, C2, . . . and MEM switches S1, S2, . . . ), and utilizing the same processing as described above in relation to FIGS. 7A through 7J. In the following description, layer designations corresponding to those employed in describing the processing of substrate 300 according to FIGS. 7A through 7J will be used, and spiral inductor designations corresponding to those employed in describing spiral inductor 400 according to FIG. 8A will be used. Base layers 306, 308, 310 of chromium, copper and chromium, respectively are deposited and a layer 320 of silicon nitride is deposited thereon, which layers 310, 320 are patterned and etched, as is shown in FIGS. 7A through 7D, to define center lead conductor 418. Then patterned photoresist layer 326 is applied and patterned gold plating layer 330 is deposited on substrate 300 followed by the stripping of the photoresist 326 and the etching away of base layers 306, 308, 310, as shown in FIGS. 7E through 7F, to form spiral conductor 410 having gaps therein and lead conductors 418, 420. Next, removable patterned photoresist 334 is applied, in particular to fill in the gaps in spiral conductor 410 and cover over center lead conductor 418, and a plating seed layer 336 is deposited thereover followed by application of a further patterned photoresist 338 and the deposit of a plated gold conductor 340 thereon, as shown in FIGS. 7G through 7I, to form the conductors of conductive air bridges 414, 416. Finally, the photoresist layers 334, 338 and portions of the seed layer 336 are removed leaving the air bridges 414, 416 spaced apart from substrate 300 and conductor 418, thereby providing a conductive connection across the gaps in spiral conductor 410 and over the center lead conductor 418, all on the same substrate with MEM switches S1, S2, . . . and capacitors C1, C2, . . . and other similar MEM switches and capacitors.

Figure 9:
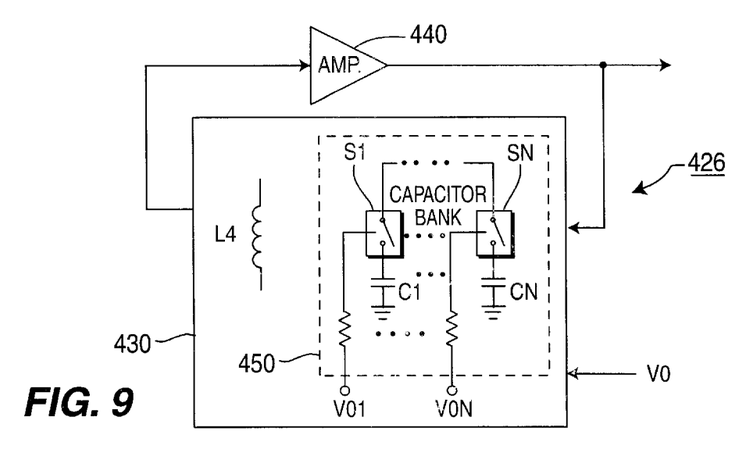
FIG. 9 is schematic block diagram of an exemplary embodiment of an oscillator circuit according to an aspect of the present invention.

FIG. 9 is an exemplary variable frequency oscillator 426 of a sort suitable for use as the local oscillators 26, 36 of FIG. 2, above. Variable frequency oscillator 426 includes an amplifier 440 having a gain greater than unity over the range of desired oscillation frequencies. Frequency-determining resonant circuit 430 includes switchable capacitance matrix 450, which is, for example, of like form and operation to capacitance matrix 50 described above, and which is coupled in circuit with inductance L4 to form resonant circuit 430 therewith. Resonant circuit 430 is coupled to the output and input terminals of amplifier 440 so that amplifier 440 will oscillate at the resonant frequency of resonant circuit 430, which frequency is determined by the inductance of inductor L4 and the capacitance of switchable capacitance matrix 450. Thus, by changing the various control signals VO to the various MEM switches of switchable capacitance matrix 450, those MEM switches are selectively opened and closed thereby to change the capacitance of switchable capacitance matrix 450 and, therefore, the frequency $f_{LO}$ at which amplifier 440 oscillates to produce controllable frequency signal $f_{LO}$.

Figure 10:
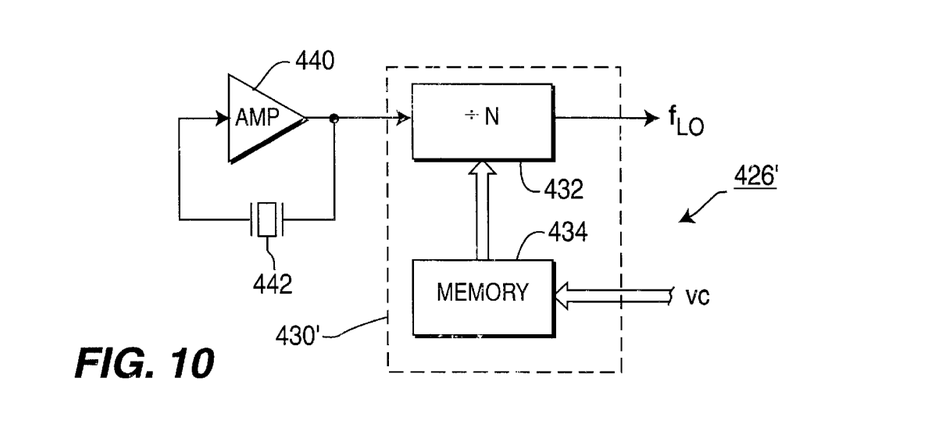
FIG. 10 is a schematic diagram of an alternative embodiment of an oscillator circuit according to an aspect of the present invention.

FIG. 10 is another exemplary variable frequency oscillator 426' of a sort also suitable for use as the local oscillators 26, 36 of FIG. 2, above. Variable frequency oscillator 426' includes an amplifier 440 having a gain greater than unity so as to oscillate at the desired oscillation frequency which is determined by a crystal 442 to which amplifier 440 is coupled. Frequency-determining circuit 430' includes, for example, a switchable programmable ÷N counter 432 of conventional type that receives the frequency signal generated by oscillating amplifier 440 which is divided by a numerical value N to produce the controllable frequency signal $f_{LO}$. Programmable counter 432 is controlled by digital words produced from memory 434 in response to being addressed by the control signals VC generated by tuning control 42. I.e. the oscillator frequency control signal VO and the filter tuning control signal VC are the same. Thus, by tuning control 42 generating the various control signals VC that are employed to control the various MEM switches of switchable reactance matrices included in tuning circuits 20, 24, 30, 34 of tuner 10, tuning control 42 also causes the numerical divisor N of programmable counter 432 to be selected, thereby to also change the controllable frequency signal $f_{LO}$.

While the present invention has been described in terms of the foregoing exemplary embodiments, variations within the scope and spirit of the present invention as defined by the claims following will be apparent to those skilled in the art. For example, although the array of capacitors C1, C2, C3, C4, C5 of FIG. 4 are shown as five capacitors connected in parallel, any combination of series and parallel connections of any number of capacitors appropriate to provide the desired capacitance values for a particular application is satisfactory. The depositions of the various materials and layers in the formation of a MEM switch capacitor array may be formed of suitable conductive materials, such as copper, aluminum, gold, silver, as metals or as inks to be fired, applied by suitable processes, such as sputtering, vacuum deposition, plating, electroplating, thin-film techniques, and the like, with or without the use of seed layers of titanium, chromium, gold or other suitable material. Similarly, the capacitance matrix, inductance matrix and the MEM switches may be formed on any suitable substrate, such as ceramic, alumina, silicon, silicon-on-sapphire, gallium arsenide and the like.

Spiral inductors 400 may be rectangular or helical or elliptical and need not be substantially square in shape as illustrated in FIG. 8A. Further, it is noted that the conductive air bridges 414, 416 of spiral inductor 400 may include plating seed layer 336 and plated gold layer 340 as described above, in which case they are similar to switch arm 224, or they may include plating seed layer 336 and omit plated gold layer 340, in which case they are similar to flexible hinge member 220.

In addition, resistors can be formed on substrate 300 along with MEM switches, capacitors, and/or inductors, from the chromium layer 306 which can be patterned and etched to form a straight, serpentine or other shaped resistor. To this end, in relation to FIG. 7F, the exposed copper layer 308 is etched away to expose chromium layer 306. An additional photomask step is performed to define on chromium layer 306 the pattern of the desired resistors, such as by ion beam milling or chemical etching. These resistors can be formed, for example, in available open areas between the gold-plated conductor segments. Alternatively, a titanium or nichrome layer could replace the base chromium layer 306 in which resistors are to be formed. In addition, resistors could be defined by deposition of cermet resistance material prior to depositing the base layer 306 which cermet resistors are connected in circuit by the gold-plated conductors formed by the process described hereinabove. Any of these alternatives are compatible with the processing described in relation to FIGS. 7A through 7J and require, at most, an additional photomasking step.

In addition, the frequencies to which the respective tuning circuits and/or oscillators of a tuner are tuned may be varied to accommodate automatic frequency control, cable TV system carrier offsets and the like by employing MEM switches to switch additional capacitors and/or inductors therein, or alternatively, for example, by a fine-tuning circuit employing a small voltage-variable capacitance, such as a varactor diode.

The switchable tuning matrices according to the present invention may find application in tuners of all types, and in the oscillators, signal processors, modulators and demodulators, transmitters and receivers, and the like employed therein.

What is claimed is:

1. A tuner comprising:
   a substrate for an electronic circuit;
   a tunable bandpass filter on said substrate having a passband including a resonant frequency responsive to a tuning control signal;
   a tunable oscillator on said substrate generating a controllable frequency signal responsive to a frequency control signal;
   a mixer on said substrate coupled to said tunable bandpass filter for receiving signals in said passband and coupled to said tunable oscillator for receiving said controllable frequency signal;
   wherein said tunable bandpass filter includes a resonant circuit comprising:
      a conductive connection on said substrate;
      a plurality of capacitors formed of conductive layers and dielectric layers on said substrate; and
      a plurality of switches formed of layers of materials on said substrate, said switches being selectively opened and closed by movement of a switch arm thereof in response to said tuning control signal, wherein ones of said plurality of switches selectively couple respective ones of said plurality of capacitors to said conductive connection;
      whereby the capacitance at said conductive connection changes in response to said tuning control signal; and
   a tuning control generating said tuning control signal and said frequency control signal.

2. The tuner of claim 1 wherein said tuning control signal and said frequency control signal are the same.

3. The tuner of claim 1 wherein the resonant circuit of said tunable bandpass filter further comprises a plurality of inductors formed of conductive layers on said substrate, wherein ones of said plurality of switches selectively couple respective ones of said plurality of inductors to said conductive connection; whereby the inductance and capacitance at said conductive connection changes in response to said tuning control signal.

4. The tuner of claim 1 wherein said tunable oscillator includes a second resonant circuit comprising:
   a second conductive connection on said substrate;
   a second plurality of capacitors formed of conductive layers and dielectric layers on said substrate; and
   a second plurality of switches formed of layers of materials on said substrate, said switches being selectively opened and closed by movement of a switch arm thereof in response to said frequency control signal, wherein ones of said second plurality of switches selectively couple respective ones of said second plurality of capacitors to said second conductive connection;
   whereby the capacitance at said second conductive connection changes in response to said frequency control signal.

5. The tuner of claim 1 wherein said passband and said controllable frequency signal include frequencies selected for applying television signals to said mixer.

6. The tuner of claim 1 wherein said tuner is for receiving television signals in the VHF television frequency band and the resonant frequency of said tunable bandpass filter is in the VHF television frequency band.

7. The tuner of claim 1 wherein said tuner is for receiving television signals in the UHF television frequency band and the resonant frequency of said tunable bandpass filter is in the UHF television frequency band.

8. The tuner of claim 1 wherein said frequency control signal controls said tunable oscillator to generate a controllable frequency signal that causes said mixer to produce an intermediate frequency signal in the range of about 40 MHz to 50 MHz.

9. The tuner of claim 1 further comprising:
   a second tunable bandpass filter on said substrate having a passband including said resonant frequency responsive to said tuning control signal;
   an amplifier coupling signals in said passband from said second tunable bandpass filter to said tunable bandpass filter;

wherein said second tunable bandpass filter includes a second resonant circuit comprising:
a second conductive connection on said substrate;
a second plurality of capacitors formed of conductive layers and dielectric layers on said substrate; and
a second plurality of switches formed of layers of materials on said substrate, said switches being selectively opened and closed by movement of a switch arm thereof in response to said tuning control signal, wherein ones of said second plurality of switches selectively couple respective ones of said second plurality of capacitors to said second conductive connection;
whereby the capacitance at said second conductive connection changes in response to said tuning control signal.

10. The tuner of claim 1 wherein said switch arm comprises a deposited metal layer spaced apart from said substrate, said switch arm having a first end anchored to said substrate and having a second end movable in relation to said substrate.

11. The tuner of claim 10 wherein said switch arm includes an enlarged portion at said second end.

12. The tuner of claim 10 wherein said tuning control signal is applied to a control conductor on said substrate that underlies said switch arm.

13. The tuner of claim 12 wherein said control conductor to which said tuning control signal is applied includes a dielectric layer between said control conductor and said switch arm.

14. A tuner for a receiver comprising:
a substrate for an electronic circuit;
a tunable bandpass amplifier on said substrate having a passband including a resonant frequency responsive to a tuning control signal, wherein said tunable bandpass amplifier includes at least one resonant circuit comprising:
a conductive connection on said substrate;
a plurality of capacitors formed of conductive layers and dielectric layers on said substrate;
a plurality of inductors formed of conductive layers on said substrate; and
a plurality of switches formed of layers of materials on said substrate, said switches being selectively opened and closed by movement of a switch arm thereof in response to said tuning control signal, wherein ones of said plurality of switches selectively couple respective ones of said plurality of capacitors and said plurality of inductors to said conductive connection;
whereby the capacitance and inductance of said resonant circuit is responsive to said tuning control signal to change the resonant frequency of said tunable bandpass amplifier;
a tunable oscillator on said substrate generating a controllable frequency signal responsive to a frequency control signal;
a mixer on said substrate coupled to said tunable bandpass amplifier for receiving signals in said passband and coupled to said tunable oscillator for receiving said controllable frequency signal, said mixer producing therefrom a signal at a predetermined intermediate frequency; and
a tuning control generating said tuning control signal and said frequency control signal.

15. The tuner of claim 14 wherein said tunable oscillator includes a second resonant circuit comprising:
a second conductive connection on said substrate;
a second plurality of capacitors formed of conductive layers and dielectric layers on said substrate; and
a second plurality of switches formed of layers of materials on said substrate, said switches being selectively opened and closed by movement of a switch arm thereof in response to said frequency control signal, wherein ones of said second plurality of switches selectively couple respective ones of said second plurality of capacitors to said second conductive connection.

16. The tuner of claim 14 wherein said passband and said controllable frequency signal include frequencies selected for applying television signals to said mixer.

17. The tuner of claim 14 wherein said tuner is for receiving television signals in the VHF television frequency band and the resonant frequency of said tunable bandpass amplifier is in the VHF television frequency band.

18. The tuner of claim 14 wherein said tuner is for receiving television signals in the UHF television frequency band and the resonant frequency of said tunable bandpass amplifier is in the UHF television frequency band.

19. The tuner of claim 14 wherein said frequency control signal controls said tunable oscillator to generate a controllable frequency signal that causes said mixer to produce an intermediate frequency signal in the range of about 40 MHz to 50 MHz.

20. The tuner of claim 14 wherein said switch arm comprises a deposited metal layer spaced apart from said substrate, said switch arm having a first end anchored to said substrate and having a second end movable in relation to said substrate.

21. The tuner of claim 20 wherein said switch arm includes an enlarged portion at said second end.

22. The tuner of claim 20 wherein said tuning control signal is applied to a control conductor on said substrate that underlies said switch arm.

23. The tuner of claim 22 wherein said control conductor to which said tuning control signal is applied includes a dielectric layer between said control conductor and said switch arm.

24. An electro-mechanically-switchable tuner for a receiver comprising:
a substrate for an electronic circuit;
a tunable bandpass filter on said substrate including a tunable resonant circuit having a passband including a resonant frequency tunable in response to tuning control voltages, said tunable bandpass filter comprising:
an inductance;
a conductive connection deposited on said substrate; wherein said conductive connection is coupled in circuit with at least said inductance to form said tunable resonant circuit;
a plurality of capacitors formed of conductive layers and dielectric layers therebetween deposited on said substrate;
a plurality of electro-mechanical switches formed of layers of materials deposited on said substrate, each of said electro-mechanical switches having a respective switch arm formed of a deposited metal layer spaced apart from said substrate, each said switch arm having a first end anchored to said substrate and having a second end movable in relation to said substrate, ones of said plurality of electro-mechanical switches being selectively opened and closed by movement of the respective switch arms thereof in response to electrostatic forces responsive to respective said tuning control voltages, wherein ones of said plurality of electro-mechanical switches selectively couple respective ones of said plurality of capacitors to said conductive connection;

whereby the capacitance coupled to said inductance at said conductive connection changes to tune the resonant frequency of said tunable bandpass filter in response to said tuning control voltages;

a tunable oscillator for generating a controllable frequency signal in response to frequency control voltages;

a mixer having a first input for receiving said controllable frequency signal and having a second input coupled to said tunable bandpass filter for receiving signals in said passband therefrom; and a tuning control voltage generator for generating said tuning control voltages and said frequency control voltages in response to selection of a channel by a user.

25. The electro-mechanically-switchable tuner of claim 24 wherein at least one of said electro-mechanical switches is connected to said inductance and is responsive to its respective control voltage to change the value of inductance.

26. The electro-mechanically-switchable tuner of claim 25 wherein said inductance includes a spiral conductor formed of a conductive layer deposited on said substrate and having a gap therein, and a bridge conductor formed of said deposited metal layer spaced apart from said substrate that bridges the gap in said spiral conductor.

27. The electro-mechanically-switchable tuner of claim 24 wherein said passband and said controllable frequency signal include frequencies selected for applying television signals to said mixer.

28. The electro-mechanically-switchable tuner of claim 24 wherein said respective control voltages are applied to respective conductors on said substrate that underlie the respective switch arms.

29. The electro-mechanically-switchable tuner of claim 24 wherein said switch arm includes an enlarged portion at said second end.

30. A tuner for a television receiver comprising:

a substrate for an electronic circuit;

a tunable UHF bandpass amplifier on said substrate having a UHF passband including a UHF resonant frequency responsive to a tuning control signal; wherein said tunable UHF bandpass amplifier includes at least one UHF resonant circuit comprising:
a first conductive connection formed on said substrate;
a first plurality of capacitors formed of conductive layers and dielectric layers formed on said substrate;
a first plurality of inductors formed of conductive layers formed on said substrate; and
a plurality of UHF switches formed of layers of materials formed on said substrate, said UHF switches being selectively opened and closed by movement of a switch arm thereof in response to said tuning control signal, wherein ones of said UHF switches couple respective ones of said first plurality of capacitors and said first plurality of inductors to said first conductive connection;

whereby the capacitance and inductance at said first conductive connection changes in response to said tuning control signal to change the resonant frequency of said tunable UHF bandpass amplifier;

a tunable UHF oscillator on said substrate generating a controllable UHF frequency signal responsive to a frequency control signal;

a UHF mixer on said substrate coupled to said tunable UHF bandpass amplifier for receiving signals in said UHF passband and coupled to said tunable UHF oscillator for receiving said controllable UHF frequency signal, said UHF mixer producing a signal at a predetermined UHF intermediate frequency therefrom;

a tunable VHF bandpass amplifier on said substrate having a VHF passband including a VHF resonant frequency responsive to a tuning control signal; wherein said tunable VHF bandpass amplifier includes at least one VHF resonant circuit comprising:
a second conductive connection formed on said substrate;
a second plurality of capacitors formed of conductive layers and dielectric layers formed on said substrate; and
a plurality of VHF switches formed of layers of materials formed on said substrate, said VHF switches being selectively opened and closed by movement of a switch arm thereof in response to said tuning control signal, wherein ones of said VHF switches couple respective ones of said second plurality of capacitors to said first conductive connection;

whereby the capacitance at said second conductive connection changes in response to said tuning control signal to change the resonant frequency of said tunable VHF bandpass amplifier;

a tunable VHF oscillator on said substrate generating a controllable VHF frequency signal responsive to a frequency control signal;

a VHF mixer on said substrate coupled to said tunable VHF bandpass amplifier for receiving signals in said VHF passband and coupled to said tunable VHF oscillator for receiving said controllable VHF frequency signal, said VHF mixer producing a signal at a predetermined VHF intermediate frequency therefrom; and a tuning control generating said tuning control signal and said frequency control signal.

31. The television tuner of claim 30 further comprising a controllable UHF/VHF switch formed on said substrate and responsive to said tuning control for connecting a television signal to a selected one of said tunable UHF bandpass amplifier and said tunable VHF bandpass amplifier.

* * * * *